(12) United States Patent
Li et al.

(10) Patent No.: US 11,067,606 B2
(45) Date of Patent: Jul. 20, 2021

(54) CURRENT SENSING MODULE

(71) Applicant: CYNTEC CO., LTD., Hsinchu (TW)

(72) Inventors: Yi-Geng Li, Hsinchu (TW); Ming-Chia Wu, Hsinchu (TW); Siao-Wei Syu, Hsinchu (TW); Chun-Chuan Chen, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 56 days.

(21) Appl. No.: 16/538,848

(22) Filed: Aug. 13, 2019

(65) Prior Publication Data

US 2020/0064380 A1 Feb. 27, 2020

Related U.S. Application Data

(60) Provisional application No. 62/720,129, filed on Aug. 21, 2018, provisional application No. 62/745,468, filed on Oct. 15, 2018.

(51) Int. Cl.
*G01R 15/20* (2006.01)
*G01R 19/32* (2006.01)

(52) U.S. Cl.
CPC ........... *G01R 15/207* (2013.01); *G01R 19/32* (2013.01)

(58) Field of Classification Search
None
See application file for complete search history.

(56) References Cited

U.S. PATENT DOCUMENTS

| 6,426,617 B1 * | 7/2002 | Haensgen | H01R 12/52 |
| | | | 324/117 H |
| 2003/0227284 A1 | 12/2003 | Marasch | |
| 2015/0309080 A1 | 10/2015 | Chae | |
| 2016/0041206 A1 * | 2/2016 | Hetzler | A45F 5/02 |
| | | | 324/126 |
| 2017/0131329 A1 * | 5/2017 | Gorai | G01R 15/207 |
| 2019/0178917 A1 * | 6/2019 | Shimizu | G01R 33/07 |
| 2019/0271601 A1 * | 9/2019 | Oka | G01K 7/42 |

FOREIGN PATENT DOCUMENTS

| EP | 0 867 725 A1 | 9/1998 |
| TW | 369602 | 9/1999 |
| WO | 2006/087342 A1 | 8/2006 |
| WO | 2018/100778 A1 | 6/2018 |

\* cited by examiner

*Primary Examiner* — Jas A Sanghera
(74) *Attorney, Agent, or Firm* — Winston Hsu

(57) ABSTRACT

A current sensing module for measuring a current includes a conductive substrate, a frame, a circuit board and a magnetic sensor. The conductive substrate has two terminals and at least one slot. The frame has two side portions and a bottom portion, wherein the bottom portion connects the two side portions to form an opening ring-shape. At least one of the two side portions is disposed in the at least one slot, such that the two side portions surround a partial path of the current. A gap exists between two top ends of the two side portions. The circuit board is disposed with respect to the conductive substrate. The magnetic sensor is connected to the circuit board and located in a space between the two side portions rather than in the gap. The magnetic sensor senses the current and generates a first current sensing signal correspondingly.

25 Claims, 14 Drawing Sheets

CURRENT SENSING MODULE

CROSS REFERENCE TO RELATED APPLICATIONS

This application claims the benefit of U.S. Provisional Application No. 62/720,129, which was filed on Aug. 21, 2018, U.S. Provisional Application No. 62/745,468, which was filed on Oct. 15, 2018, and are incorporated herein by reference.

BACKGROUND OF THE INVENTION

1. Field of the Invention

The invention relates to a current sensing module and, more particularly, to a current sensing module equipped with a frame for measuring a current accurately.

2. Description of the Related Art

In many applications, a current has to be measured and monitored accurately. For example, in vehicles having a battery used for various purposes, such as starting an engine or powering electrical components, the current is measured and monitored for ensuring normal operation and driving safety. If the current cannot be measured accurately, driving safety of a vehicle will be influenced. Accordingly, how to enhance reliability of the current sensing module has become a significant research issue.

SUMMARY OF THE INVENTION

The invention provides a current sensing module equipped with a frame for measuring a current accurately, so as to solve the aforesaid problems.

According to an embodiment of the invention, a current sensing module for measuring a current comprises a conductive substrate, a frame, a circuit board and a magnetic sensor. The conductive substrate has two terminals and at least one slot. The current flows from one terminal to the other terminal. The at least one slot extends in a direction of the current. The frame has two side portions and a bottom portion, wherein the bottom portion connects the two side portions to form an opening ring-shape. The two side portions are parallel to each other. At least one of the two side portions is disposed in the at least one slot, such that the two side portions surround a partial path of the current. A gap exists between two top ends of the two side portions. The circuit board is disposed with respect to the conductive substrate. The magnetic sensor is connected to the circuit board and located in a space between the two side portions rather than in the gap. The magnetic sensor senses the current and generates a first current sensing signal correspondingly.

According to another embodiment of the invention, a current sensing module for measuring a current comprises a conductive substrate, a frame, a circuit board and a magnetic sensor. The conductive substrate has two terminals. The current flows from one terminal to the other terminal. The frame surrounds the conductive substrate. The frame has two opposite surfaces. The current passes through a space between the two opposite surfaces to generate a magnetic flux. The frame is made of Permalloy with grain size between 350 μm and 600 μm. The circuit board is disposed with respect to the conductive substrate. The magnetic sensor is connected to the circuit board and located between the two opposite surfaces.

As mentioned in the above, the magnetic sensor is located inside the frame. Since the frame can increase magnetic flux, stabilize magnetic field and reduce external interference for the magnetic sensor, the current sensed by the magnetic sensor will be more accurate. Accordingly, the reliability of the current sensing module is enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
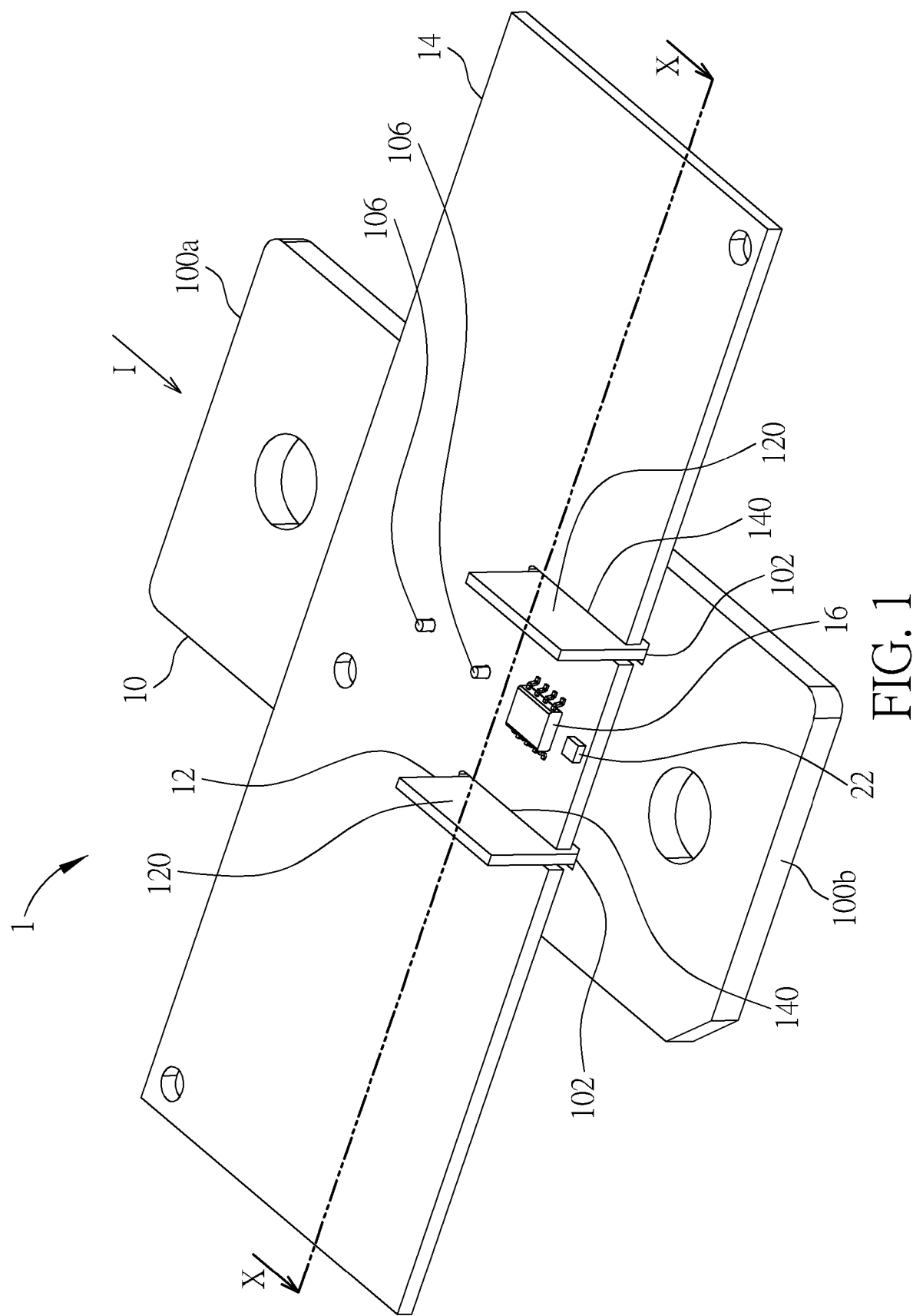
FIG. 1 is a perspective view illustrating a current sensing module according to an embodiment of the invention.
Figure 2:
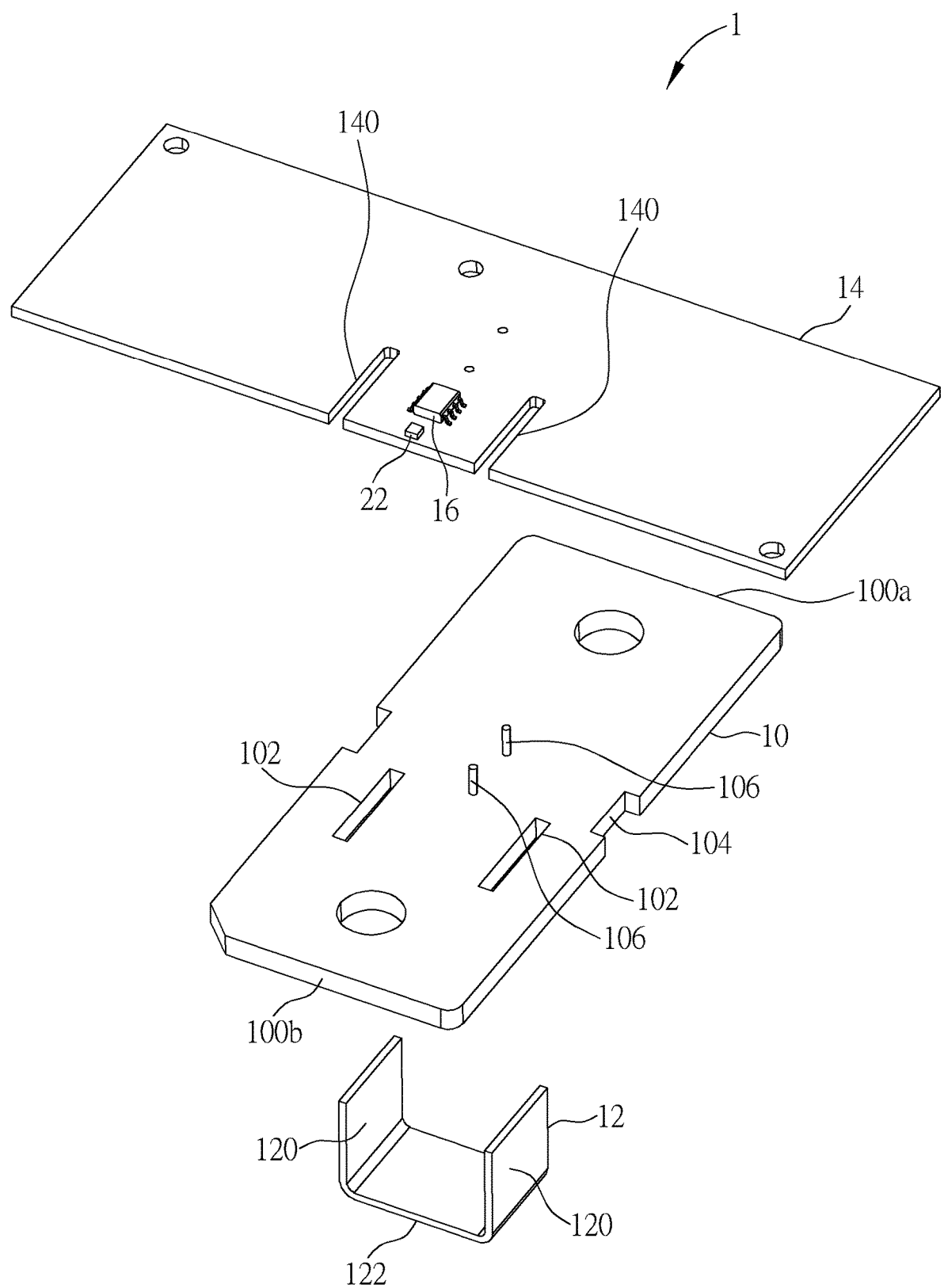
FIG. 2 is an exploded view illustrating the current sensing module shown in FIG. 1.
Figure 3:
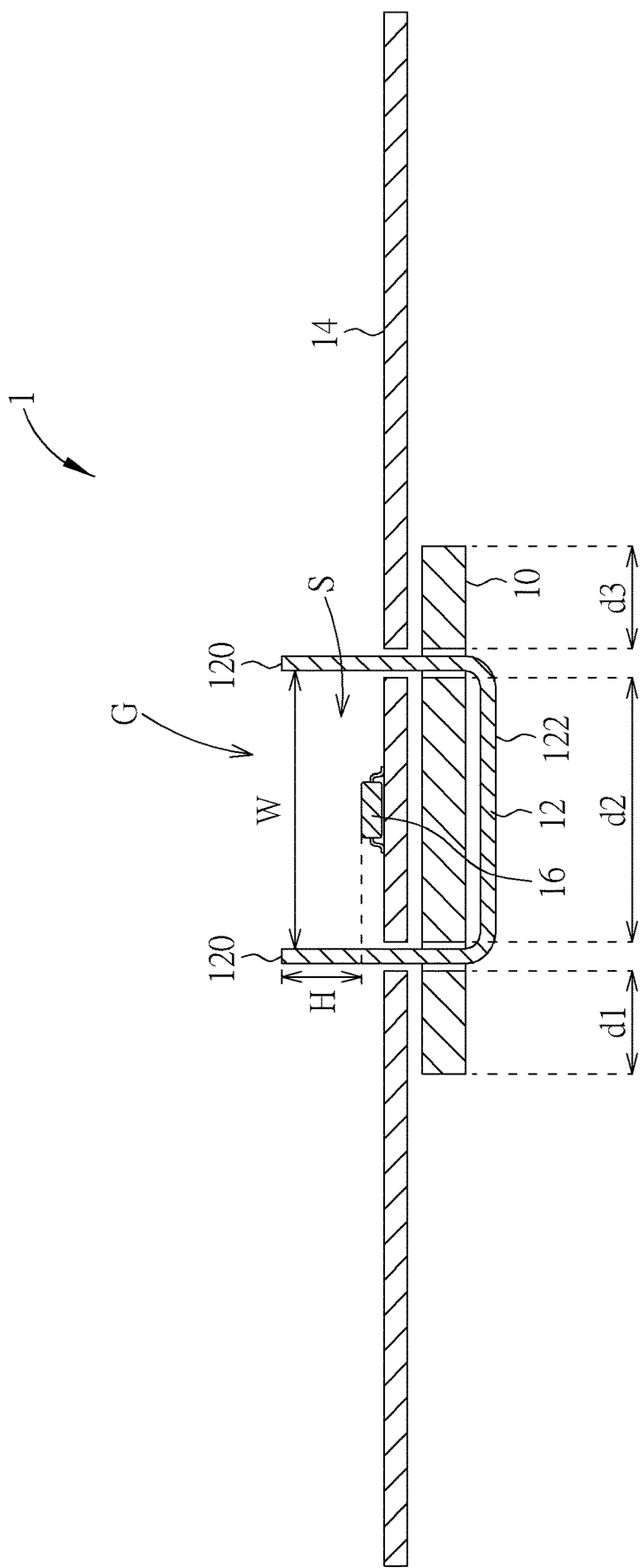
FIG. 3 is a sectional view illustrating the current sensing module shown in FIG. 1 along line X-X.
Figure 4:
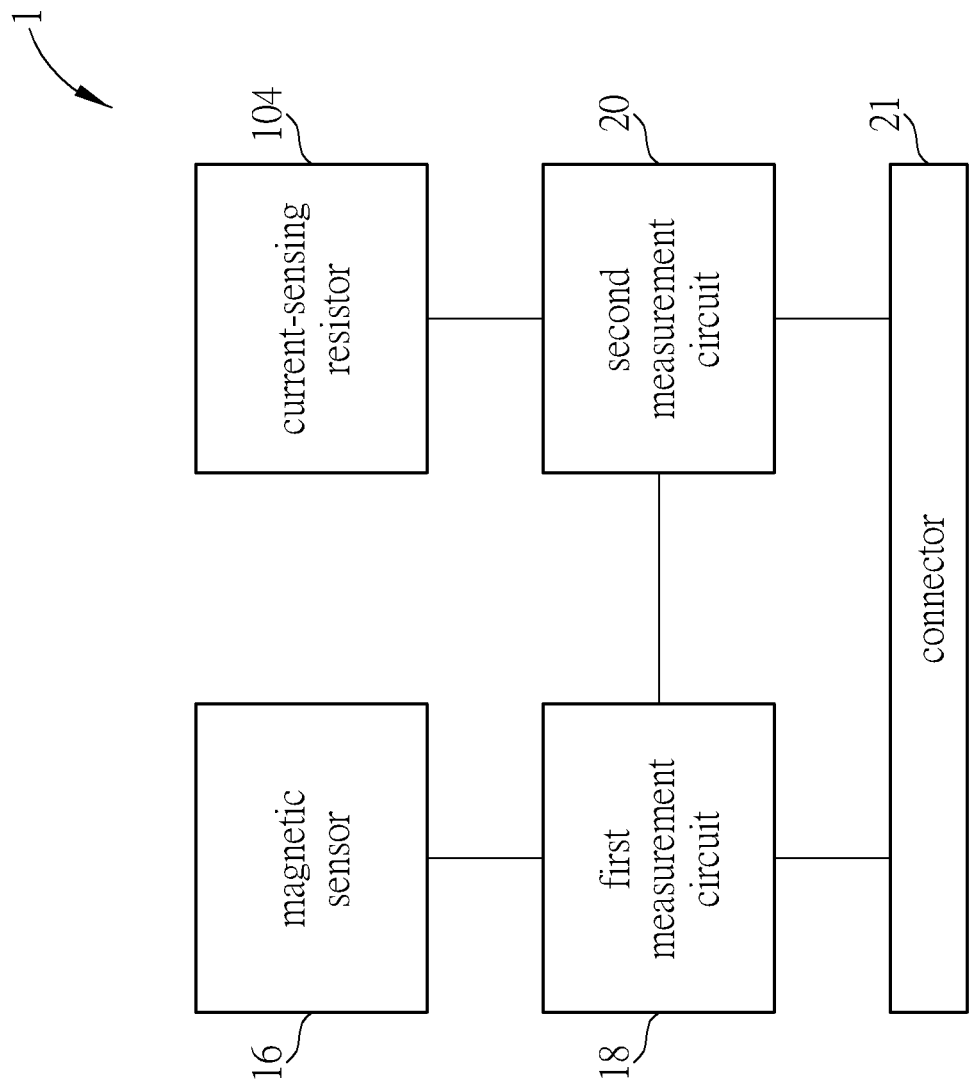
FIG. 4 is a functional block diagram illustrating the current sensing module according to an embodiment of the invention.

Referring to FIGS. 1 to 4, FIG. 1 is a perspective view illustrating a current sensing module 1 according to an embodiment of the invention, FIG. 2 is an exploded view illustrating the current sensing module 1 shown in FIG. 1, FIG. 3 is a sectional view illustrating the current sensing module 1 shown in FIG. 1 along line X-X, and FIG. 4 is a functional block diagram illustrating the current sensing module 1 according to an embodiment of the invention.

As shown in FIGS. 1 to 3, the current sensing module 1 comprises a conductive substrate 10, a frame 12, a circuit board 14 and a magnetic sensor 16. The conductive substrate 10 has two terminals 100a, 100b and at least one slot 102. In this embodiment, the conductive substrate 10 has two slots 102, but is not so limited. The current sensing module 1 is used for measuring a current I, wherein the current I flows from one terminal 100a to the other terminal 100b. The two slots 102 extend in a direction of the current I.

The conductive substrate 10 may be a bus bar or a shunt according to practical applications. When the conductive substrate 10 is a bus bar, the conductive substrate 10 may have a resistivity difference within a predetermined range from $1.59 \times 10^{-8}$ Ωm to $1.1 \times 10^{-7}$ Ωm, wherein the conductive substrate 10 may be made of silver, copper, gold, aluminum, wolfram, brass, iron, platinum, or a combination thereof.

In this embodiment, the conductive substrate 10 may further comprise a current-sensing resistor 104 and two sensing portions 106, wherein the current-sensing resistor 104 is connected in a current path between the two terminals 100a, 100b to form a shunt. In this embodiment, a resistivity of the current-sensing resistor 104 may be 10 to 100 times a resistivity of the terminal 100a, 100b. The two sensing portions 106 are disposed at opposite sides of the current-sensing resistor 104.

The frame 12 has two side portions 120 and a bottom portion 122, wherein the bottom portion 122 connects the two side portions 120 to form an opening ring-shape (e.g. U-shape or C-shape). The two side portions 120 are parallel to each other. The two side portions 120 of the frame 12 are disposed in the two slots 102 of the conductive substrate 10, such that the two side portions 120 surround a partial path of the current I. In this embodiment, a percentage of the conductive substrate 10 surrounded by the two side portions 120 may be between 50% and 90%, but is not so limited. For example, as shown in FIG. 3, the conductive substrate 10 may be divided into three portions with lengths d1, d2 and d3 by the two side portions 120 of the frame 12, wherein the portion with length d2 is surrounded by the two side portions 120. Therefore, d2/(d1+d2+d3) may be between 50% and 90%. Furthermore, a gap G exists between two top ends of the two side portions 120 to form an opening between two terminals of the frame 12. In another embodiment, the conductive substrate 10 may have one single slot 102 formed thereon. Accordingly, one side portion 120 is disposed in the single slot 102 and the other side portion 120 is disposed outside the conductive substrate 10, so as to surround a partial path of the current I.

The magnetic sensor 16 is connected to the circuit board 14 and the circuit board 14 is disposed with respect to the conductive substrate 10. In this embodiment, the circuit board 14 may have two slots 140. The two side portions 120 of the frame 12 passes through the two slots 140 of the circuit board 14, such that the circuit board 14 is disposed above the conductive substrate 10. At this time, the magnetic sensor 16 is located in a space S between the two side portions 120 of the frame 12 rather than in the gap G. In other words, the magnetic sensor 16 is located inside the frame 12. In this embodiment, the magnetic sensor 16 may be Hall sensor, magnetoresistive (MR) sensor, giant magnetoresistance (GMR) sensor, tunnel magnetoresistance (TMR) sensor, anisotropic magneto-resistive (AMR) sensor, or the like.

Accordingly, when the current I flows from one terminal 100a to the other terminal 100b, the magnetic sensor 16 senses the current I and generates a first current sensing signal correspondingly. Furthermore, a second current sensing signal corresponding to the current I is generated between the two sensing portions 106 of the conductive substrate 10.

As shown in FIG. 4, the current sensing module 1 may further comprise a first measurement circuit 18 and a second measurement circuit 20, wherein the first measurement circuit 18 may be connected to the magnetic sensor 16 and the second measurement circuit 20 may be connected to the current-sensing resistor 104 of the conductive substrate 10. In this embodiment, the first measurement circuit 18 and the second measurement circuit 20 may be coupled to one single connector 21, as shown in FIG. 4. However, in another embodiment, the first measurement circuit 18 and the second measurement circuit 20 may be coupled to individual connectors. The first measurement circuit 18 and the second measurement circuit 20 operate independently in malfunction mode. In other words, if one of the first measurement circuit 18 and the second measurement circuit 20 fails, the other one can still operate normally. It should be noted that although the first measurement circuit 18 and the second measurement circuit 20 have individual controllers, analog-to-digital converters, and so on, the individual controllers may transmit data and cooperate with each other under normal operation.

In this embodiment, the first measurement circuit 18 may cooperate with the magnetic sensor 16 to generate the first current sensing signal. For example, the first measurement circuit 18 may perform analog-to-digital conversion, temperature correction, error correction, communication interface conversion, voltage division, current division, or other processes for the first current sensing signal. In practical applications, the first measurement circuit 18 may comprise a controller, an analog-to-digital converter, a connector, and other necessary components.

Similarly, the second measurement circuit 20 may cooperate with the current-sensing resistor 104 of the conductive substrate 10 to generate the second current sensing signal. For example, the second measurement circuit 20 may perform analog-to-digital conversion, temperature correction, error correction, communication interface conversion, voltage division, current division, or other processes for the second current sensing signal. In practical applications, the second measurement circuit 20 may comprise a controller, an analog-to-digital converter, a connector, and other necessary components.

It should be noted that the first measurement circuit 18 and the second measurement circuit 20 may share one single connector to output the first current sensing signal and the second current sensing signal. Furthermore, if the first current sensing signal and the second current sensing signal do not need to be converted into digital data, the aforesaid analog-to-digital converter can be omitted.

Furthermore, the current sensing module 1 may further comprise a temperature sensor 22, wherein the temperature sensor 22 may be connected to the circuit board 14 and thermally coupled to the conductive substrate 10. The temperature sensor 22 is configured to sense a temperature of the conductive substrate 10 and generate a temperature sensing signal correspondingly. Then, the second measurement circuit 20 may calibrate the second current sensing signal according to the temperature sensing signal, so as to enhance the accuracy of the second current sensing signal. In this embodiment, the current sensing module 1 may further comprise a thermal conductive material (not shown) covering the temperature sensor 22 and the conductive substrate 10. Accordingly, the temperature sensing signal sensed by the temperature sensor 22 will be more accurate.

Since the magnetic sensor 16 is located inside the frame 12, the frame 12 can increase magnetic flux, stabilize magnetic field and reduce external interference for the magnetic sensor 16, such that the current I sensed by the magnetic sensor 16 will be more accurate. Furthermore, since the side portions 120 of the frame 12 are disposed in the slots 102 of the conductive substrate 10, the side portions 120 of the frame 12 may be positioned as close as possible to the magnetic sensor 16. The smaller the distance between the side portions 120 of the frame 12 and the magnetic sensor 16 is, the smaller the external interference is. Accordingly, the invention can further reduce the external interference for the magnetic sensor 16.

Still further, the current I passing through the conductive substrate 10 will generate a magnetic field (mT), such that the magnetic sensor 16 will be influenced by the magnetic field to generate the first current sensing signal (mV). Then, by means of the relation between the first current sensing signal and the current I, the measured current can be calculated. The relation between the magnetic field, the first current sensing signal and the current I is shown by equation 1 below.

$$mT/I \times mV/mT = mV/I.$$ Equation 1:

The size of the frame 12 will influence the magnetic field transmitted to the magnetic sensor 16, so as to cause measured error. Therefore, the measured error can be reduced by adjusting the size of the frame 12. In this embodiment, a width W between the two side portions 120 and a height H between the magnetic sensor 16 and the top end of the side portion 120 satisfy an inequality 1 as follows, such that the first current sensing signal sensed by the magnetic sensor 16 will be more accurate.

$$\frac{W}{4} \leq H \leq \frac{W}{2}.$$ Inequality 1

In this embodiment, the frame 12 may be made of Permalloy with grain size between 350 μm and 600 μm, such that remanence may be further reduced. Accordingly, the invention can reduce offset error caused by remanence.

In this embodiment, the frame 12 may be grounded to the circuit board 14 by a wire or solder. Furthermore, an electrical insulating material (e.g. epoxy or silicon) with low thermal conductivity may be filled between the conductive substrate 10 and the frame 12. Moreover, the conductive substrate 10, the frame 12 and the circuit board 14 may be fixed by glue.

Figure 5:
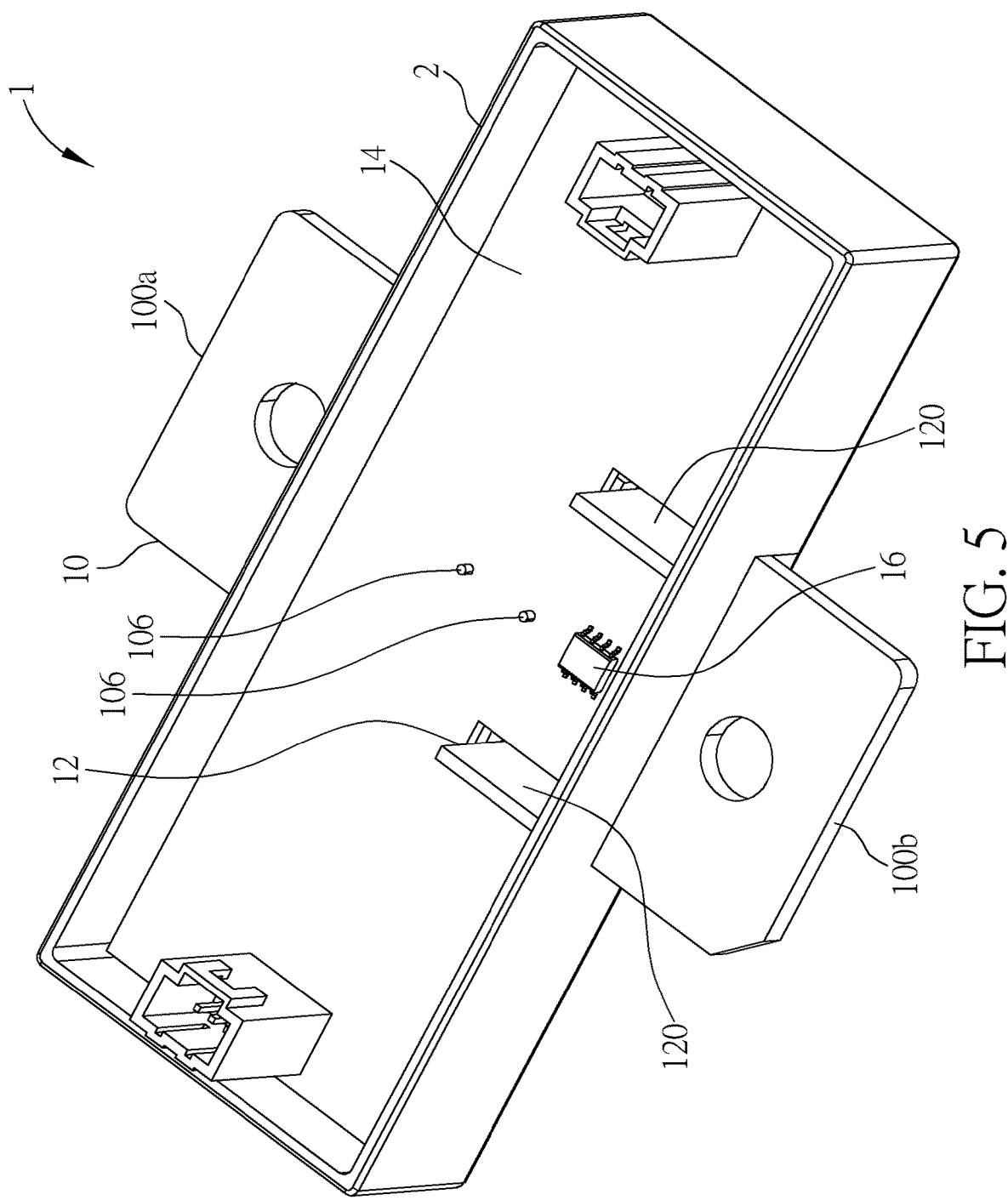
FIG. 5 is a perspective illustrating the current sensing module shown in FIG. 1 being disposed in a casing.

Referring to FIG. 5, FIG. 5 is a perspective illustrating the current sensing module 1 shown in FIG. 1 being disposed in a casing 2. As shown in FIG. 5, the current sensing module 1 may be disposed in a casing 2, and the conductive substrate 10, the frame 12 and the circuit board 14 may be fixed by glue, so as to form a package structure.

Figure 6:
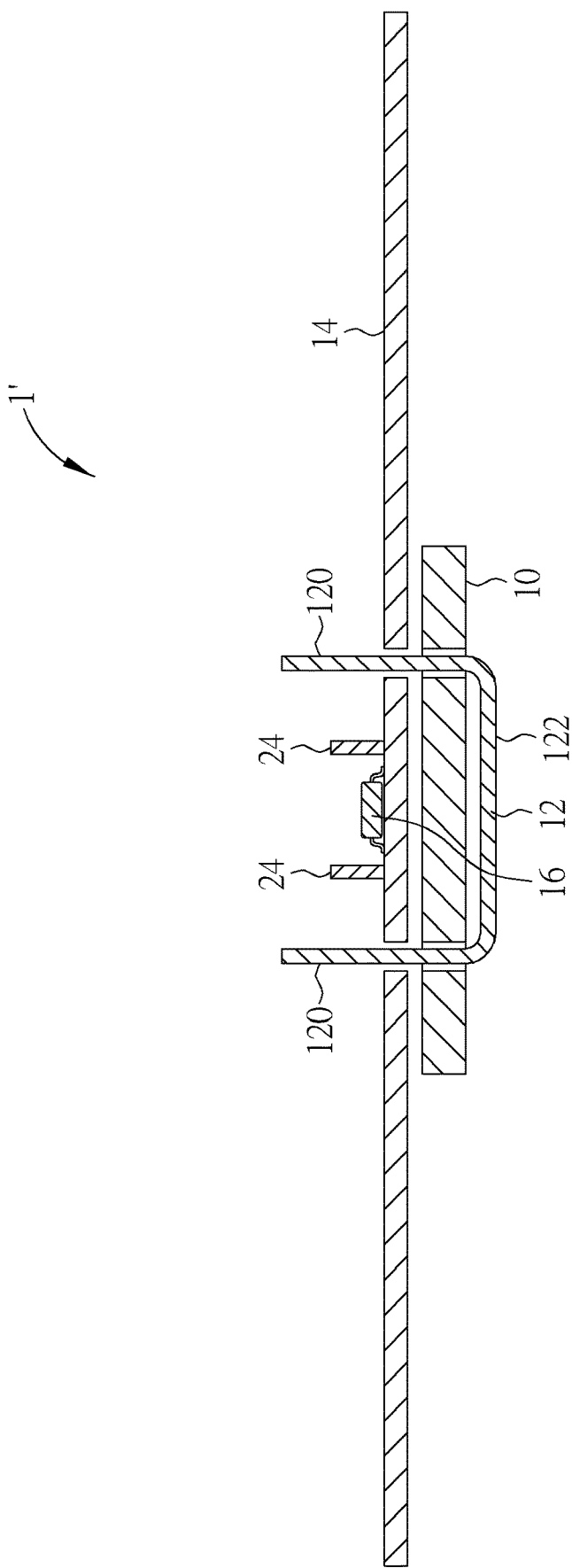
FIG. 6 is a sectional view illustrating a current sensing module according to another embodiment of the invention.

Referring to FIG. 6, FIG. 6 is a sectional view illustrating a current sensing module 1' according to another embodiment of the invention. The main difference between the current sensing module 1' and the aforesaid current sensing module 1 is that the current sensing module 1' further comprises two magnetic structures 24, as shown in FIG. 6. The two magnetic structures 24 are parallel to the direction of the current I and the magnetic sensor 16 is located between the two magnetic structures 24. The two magnetic structures 24 can collect magnetic flux for the magnetic sensor 16, so as to enhance intensity and stability of magnetic field.

Figure 7:
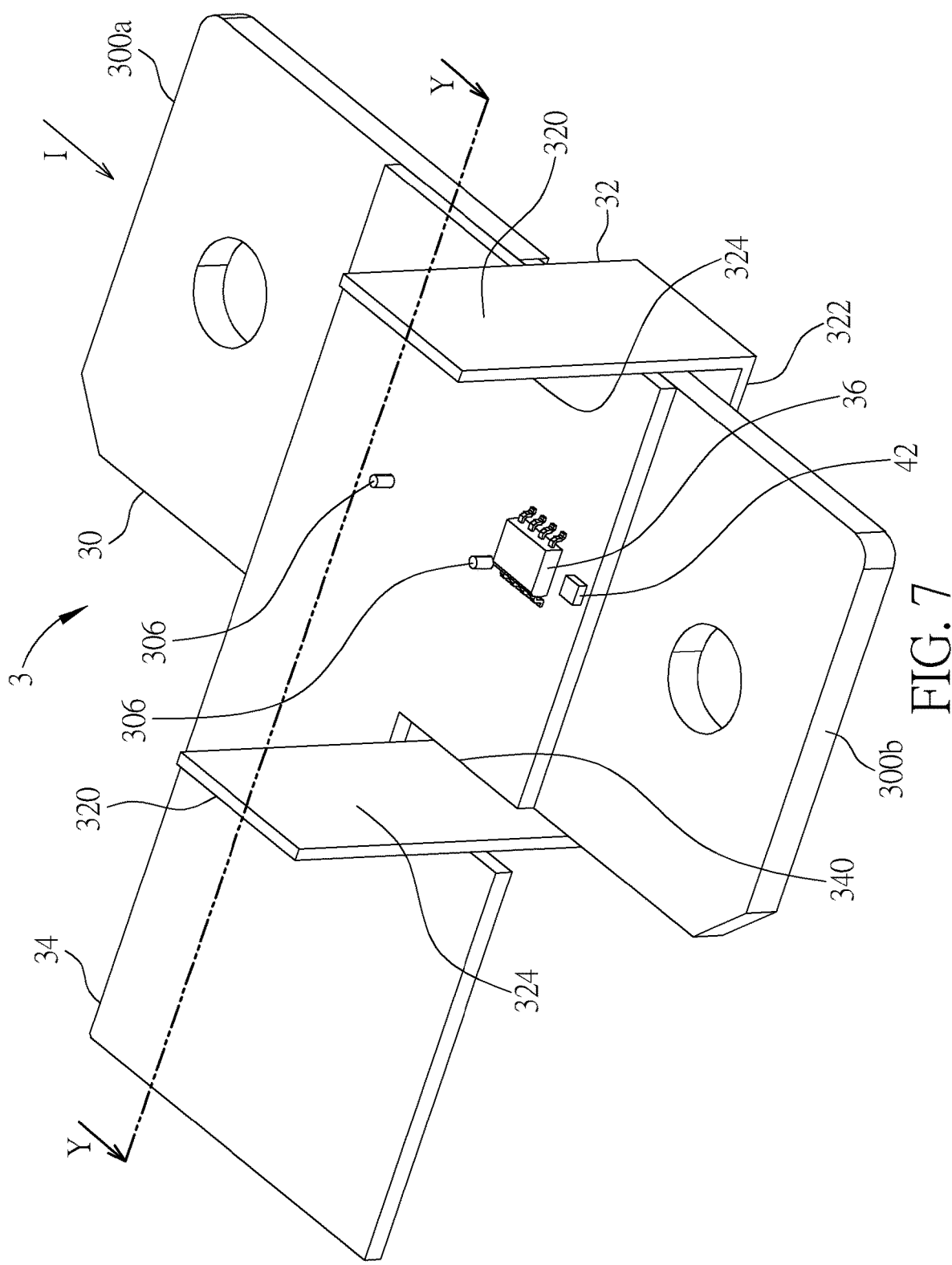
FIG. 7 is a perspective view illustrating a current sensing module according to another embodiment of the invention.
Figure 8:
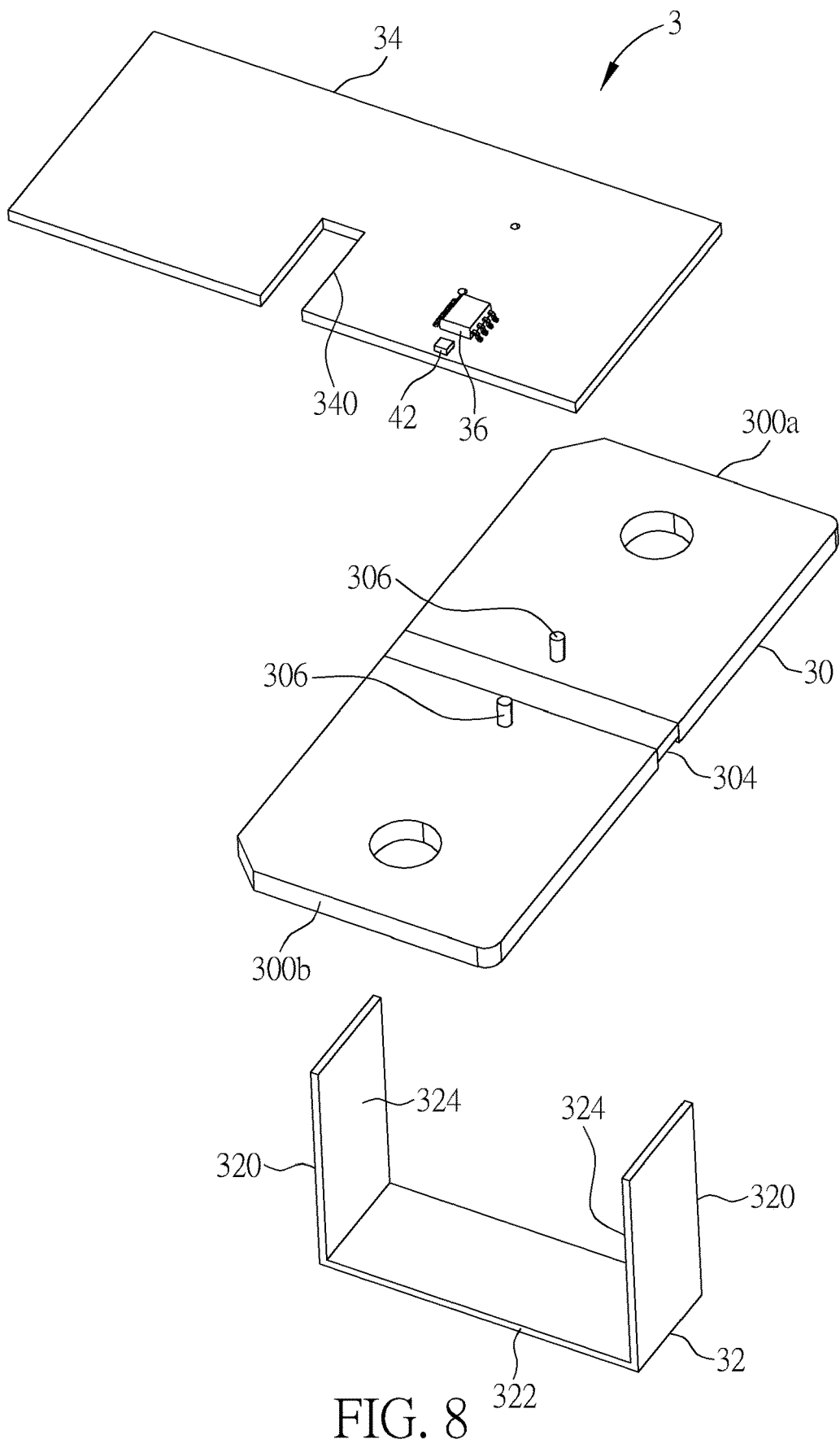
FIG. 8 is an exploded view illustrating the current sensing module shown in FIG. 7.
Figure 9:
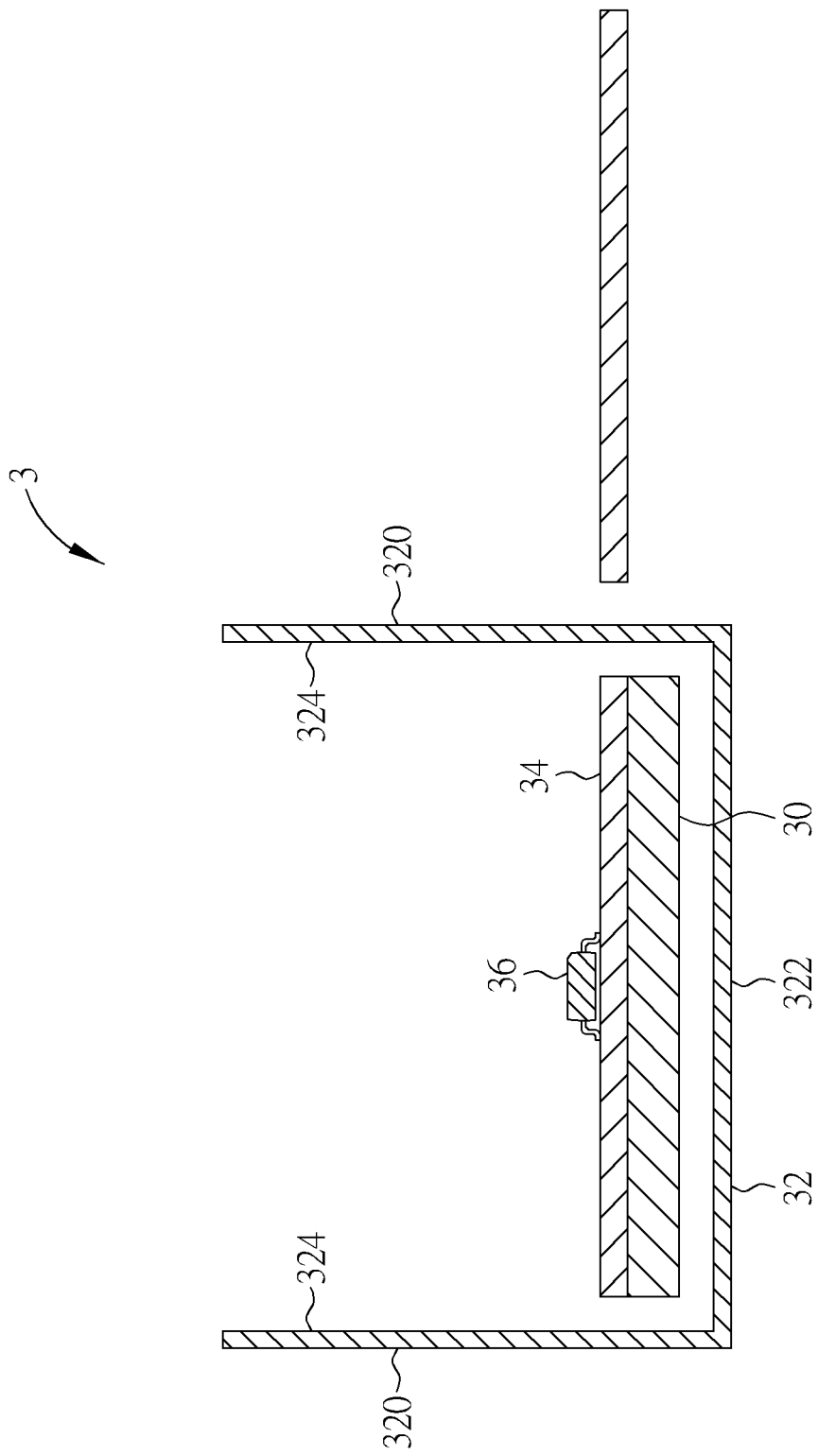
FIG. 9 is a sectional view illustrating the current sensing module shown in FIG. 7 along line Y-Y.
Figure 10:
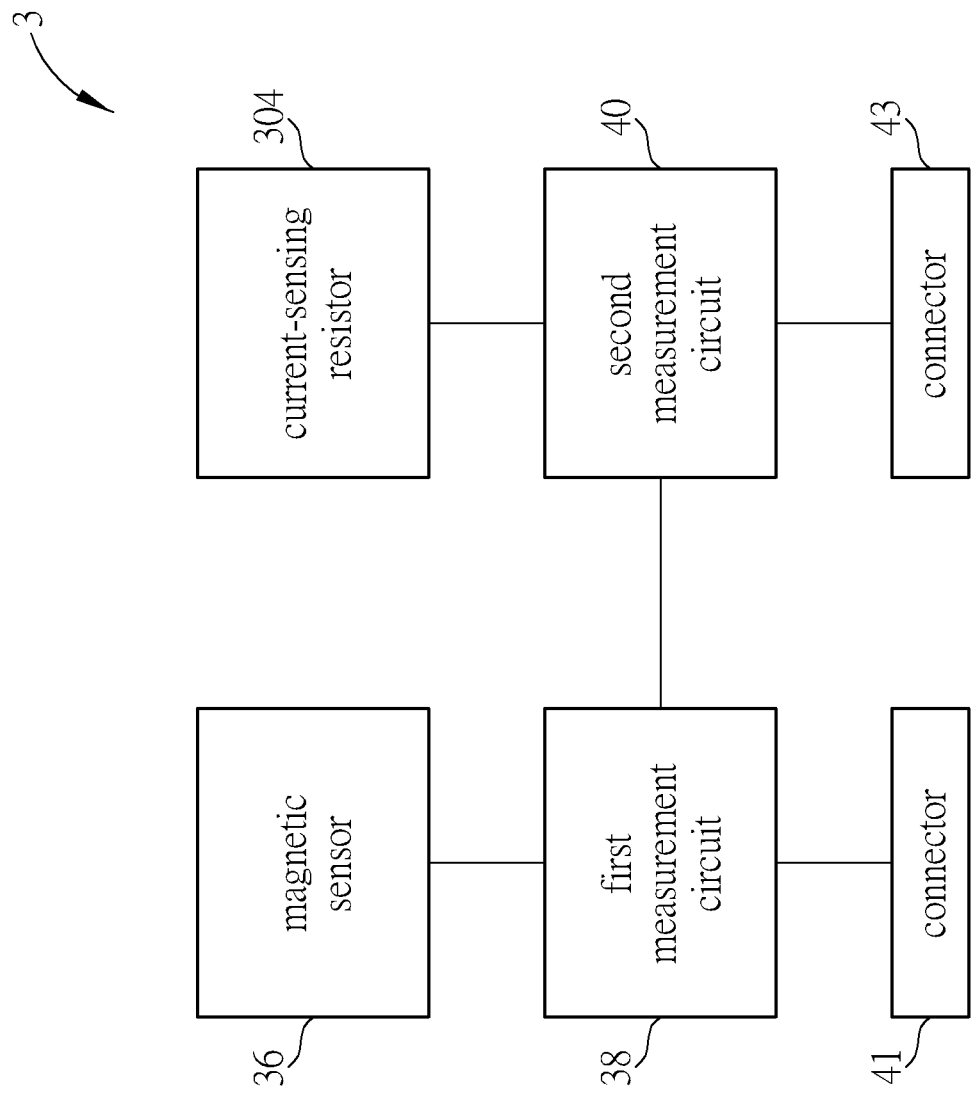
FIG. 10 is a functional block diagram illustrating the current sensing module according to an embodiment of the invention.

Referring to FIGS. 7 to 10, FIG. 7 is a perspective view illustrating a current sensing module 3 according to another embodiment of the invention, FIG. 8 is an exploded view illustrating the current sensing module 3 shown in FIG. 7, FIG. 9 is a sectional view illustrating the current sensing module 3 shown in FIG. 7 along line Y-Y, and FIG. 10 is a functional block diagram illustrating the current sensing module 3 according to an embodiment of the invention.

As shown in FIGS. 7 to 9, the current sensing module 3 comprises a conductive substrate 30, a frame 32, a circuit board 34 and a magnetic sensor 36. The conductive substrate 10 has two terminals 300a, 300b. The current sensing module 1 is used for measuring a current I, wherein the current I flows from one terminal 300a to the other terminal 300b.

The conductive substrate 30 may be a bus bar or a shunt according to practical applications. When the conductive substrate 30 is a bus bar, the conductive substrate 30 may have a resistivity difference within a predetermined range from $1.59 \times 10^{-8}$ Ωm to $1.1 \times 10^{-7}$ Ωm, wherein the conductive substrate 30 may be made of silver, copper, gold, aluminum, wolfram, brass, iron, platinum, or a combination thereof.

In this embodiment, the conductive substrate 30 may further comprise a current-sensing resistor 304 and two sensing portions 306, wherein the current-sensing resistor 304 is connected in a current path between the two terminals 300a, 300b to form a shunt. In this embodiment, a resistivity of the current-sensing resistor 304 may be 10 to 100 times a resistivity of the terminal 300a, 300b. The two sensing portions 306 are disposed at opposite sides of the current-sensing resistor 304.

The frame 32 surrounds the conductive substrate 30. In this embodiment, the frame 32 has two side portions 320 and a bottom portion 322, wherein the bottom portion 322 connects the two side portions 320 to form an opening ring-shape. The two side portions 320 are parallel to each other. Furthermore, the frame 32 has two opposite surfaces 324, wherein the two opposite surfaces 324 are provided by the two side portions 320, respectively. The frame 32 may be, but not limited to, a stack structure with multiple sheets or layers.

The magnetic sensor 36 is connected to the circuit board 34 and the circuit board 34 is disposed with respect to the conductive substrate 30. In this embodiment, the circuit board 34 may have a slot 340. One of the side portions 320 of the frame 32 passes through the slot 340 of the circuit board 34, such that the conductive substrate 30 is located between the circuit board 34 and the bottom portion 322 of the frame 32. At this time, the magnetic sensor 36 is located inside the frame 32. In this embodiment, the magnetic sensor 36 may be Hall sensor, magnetoresistive (MR) sensor, giant magnetoresistance (GMR) sensor, tunnel magnetoresistance (TMR) sensor, anisotropic magneto-resistive (AMR) sensor, or the like.

Accordingly, when the current I flows from one terminal 300a to the other terminal 300b, the current I passes through a space between the two opposite surfaces 324 of the frame 32 to generate a magnetic flux, such that the magnetic sensor 36 senses the current I and generates a first current sensing signal correspondingly. Furthermore, a second current sensing signal corresponding to the current I is generated between the two sensing portions 306 of the conductive substrate 30.

As shown in FIG. 10, the current sensing module 3 may further comprise a first measurement circuit 38 and a second measurement circuit 40, wherein the first measurement circuit 38 may be connected to the magnetic sensor 36 and the second measurement circuit 40 may be connected to the current-sensing resistor 304 of the conductive substrate 30. In this embodiment, the first measurement circuit 38 and the second measurement circuit 40 may be coupled to individual connectors 41, 43, as shown in FIG. 10. However, in another embodiment, the first measurement circuit 38 and the second measurement circuit 40 may be coupled to one single connector. The first measurement circuit 38 and the second measurement circuit 40 operate independently in malfunction mode. In other words, if one of the first measurement circuit 38 and the second measurement circuit 40 fails, the other one can still operate normally. It should be noted that although the first measurement circuit 38 and the second measurement circuit 40 have individual controllers, analog-to-digital converters, and so on, the individual controllers may transmit data and cooperate with each other under normal operation.

In this embodiment, the first measurement circuit 38 may cooperate with the magnetic sensor 36 to generate the first current sensing signal. For example, the first measurement circuit 38 may perform analog-to-digital conversion, temperature correction, error correction, communication interface conversion, voltage division, current division, or other processes for the first current sensing signal. In practical applications, the first measurement circuit 38 may comprise a controller, an analog-to-digital converter, a connector, and other necessary components.

Similarly, the second measurement circuit 40 may cooperate with the current-sensing resistor 304 of the conductive substrate 30 to generate the second current sensing signal. For example, the second measurement circuit 40 may perform analog-to-digital conversion, temperature correction, error correction, communication interface conversion, voltage division, current division, or other processes for the second current sensing signal. In practical applications, the second measurement circuit 40 may comprise a controller, an analog-to-digital converter, a connector, and other necessary components.

It should be noted that the first measurement circuit 38 and the second measurement circuit 40 may share one single connector to output the first current sensing signal and the second current sensing signal. Furthermore, if the first current sensing signal and the second current sensing signal do not need to be converted into digital data, the aforesaid analog-to-digital converter can be omitted.

Furthermore, the current sensing module 3 may further comprise a temperature sensor 42, wherein the temperature sensor 42 may be connected to the circuit board 34 and thermally coupled to the conductive substrate 30. The temperature sensor 42 is configured to sense a temperature of the conductive substrate 30 and generate a temperature sensing signal correspondingly. Then, the second measurement circuit 40 may calibrate the second current sensing signal according to the temperature sensing signal, so as to enhance the accuracy of the second current sensing signal. In this embodiment, the current sensing module 3 may further comprise a thermal conductive material (not shown) covering the temperature sensor 42 and the conductive substrate 30. Accordingly, the temperature sensing signal sensed by the temperature sensor 42 will be more accurate.

Since the magnetic sensor 36 is located inside the frame 32, the frame 32 can increase magnetic flux, stabilize magnetic field and reduce external interference for the magnetic sensor 36, such that the current I sensed by the magnetic sensor 36 will be more accurate. In this embodiment, the frame 32 may be made of Permalloy with grain size between 350 μm and 600 μm, such that remanance may be further reduced. Accordingly, the invention can reduce offset error and loss of the frame 32 caused by remanance.

In this embodiment, the frame 32 may be grounded to the circuit board 34 by a wire or solder. Furthermore, an electrical insulating material (e.g. epoxy or silicon) with low thermal conductivity may be filled between the conductive substrate 30 and the frame 32. Moreover, the conductive substrate 30, the frame 32 and the circuit board 34 may be fixed by glue.

Figure 11:
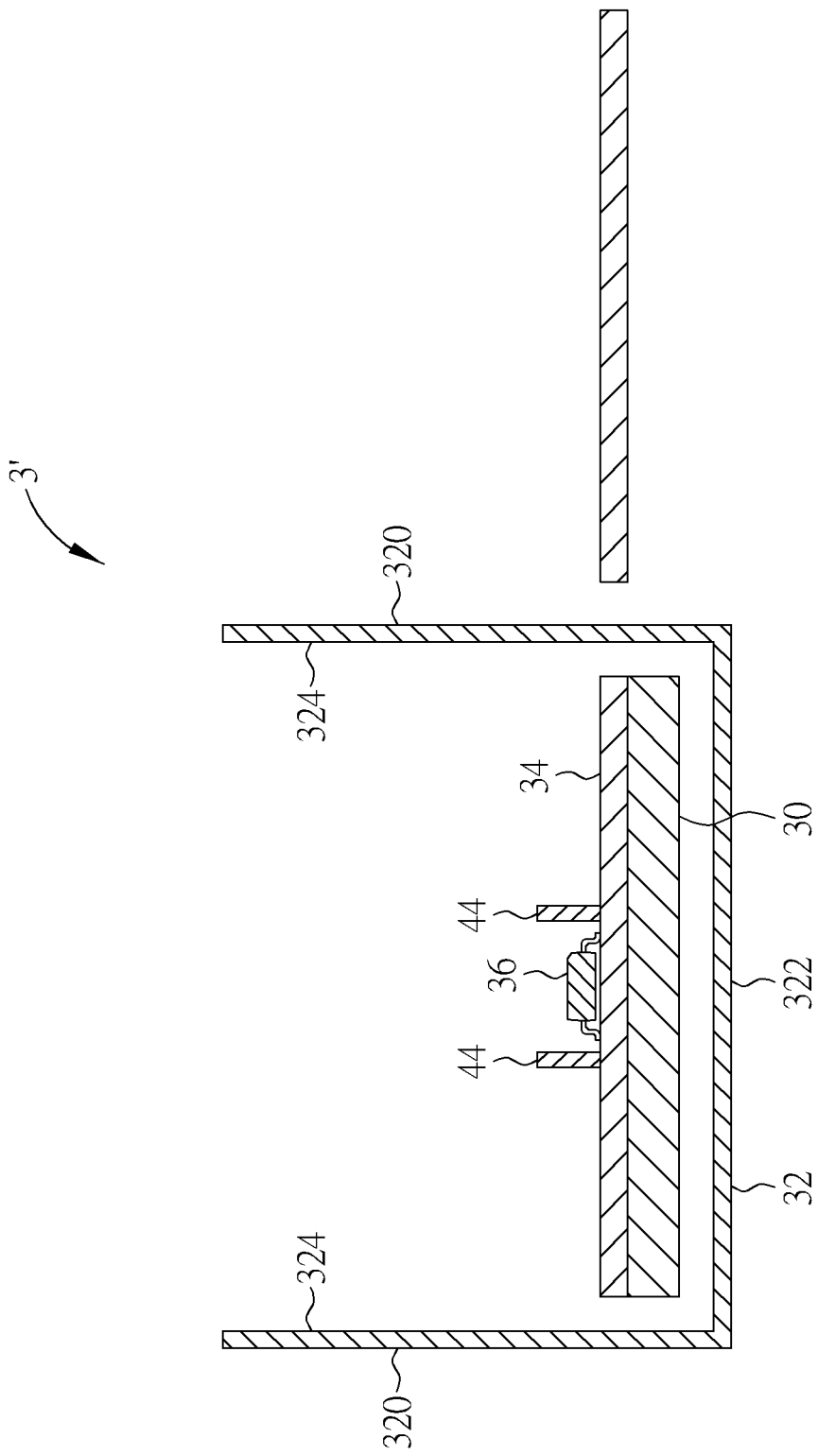
FIG. 11 is a sectional view illustrating a current sensing module according to another embodiment of the invention.

Referring to FIG. 11, FIG. 11 is a sectional view illustrating a current sensing module 3' according to another embodiment of the invention. The main difference between the current sensing module 3' and the aforesaid current sensing module 3 is that the current sensing module 3' further comprises two magnetic structures 44, as shown in FIG. 11. The two magnetic structures 44 are parallel to the direction of the current I and the magnetic sensor 36 is located between the two magnetic structures 44. The two magnetic structures 44 can collect magnetic flux for the magnetic sensor 36, so as to enhance intensity and stability of magnetic field.

Figure 12:
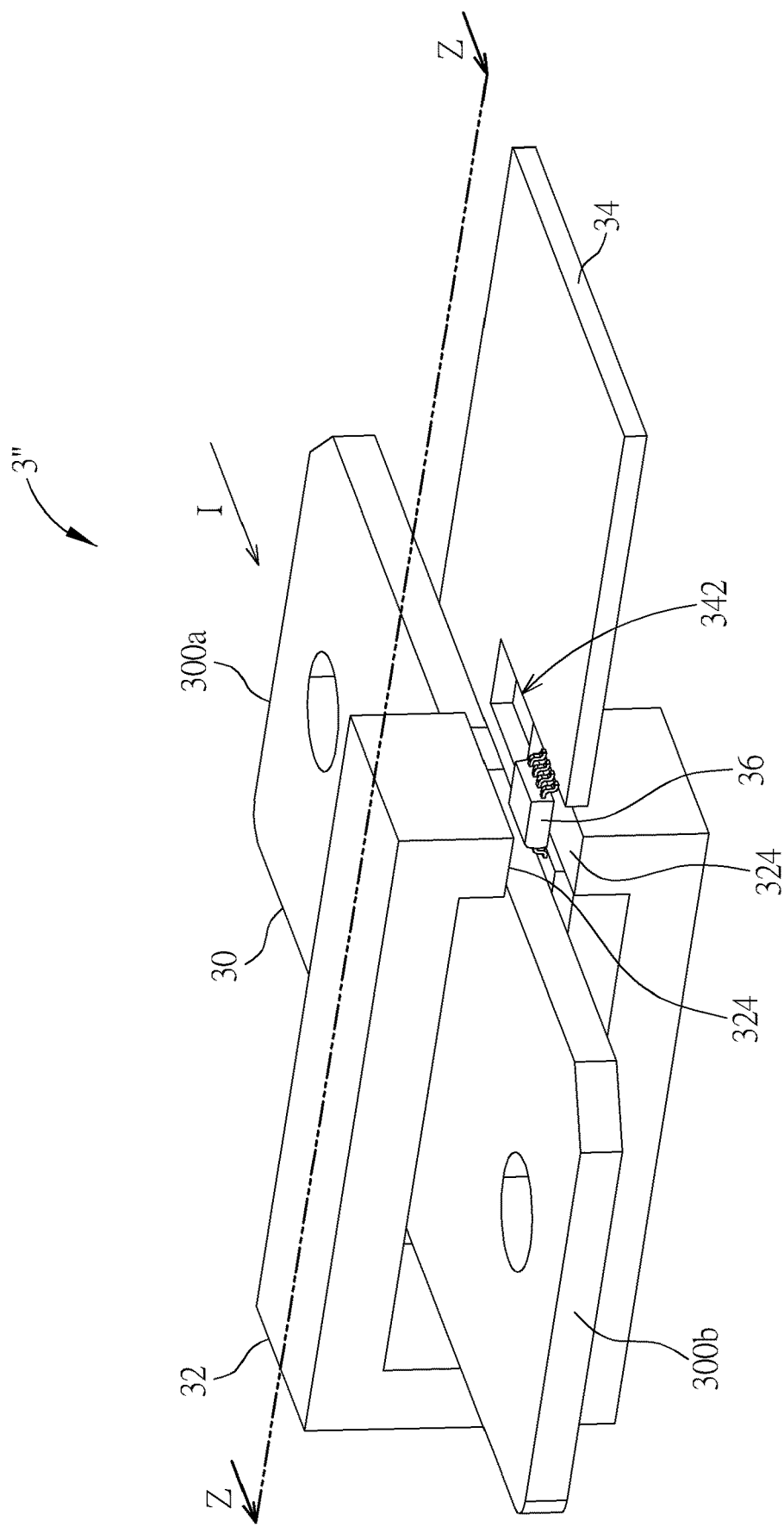
FIG. 12 is a perspective view illustrating a current sensing module according to another embodiment of the invention.
Figure 13:
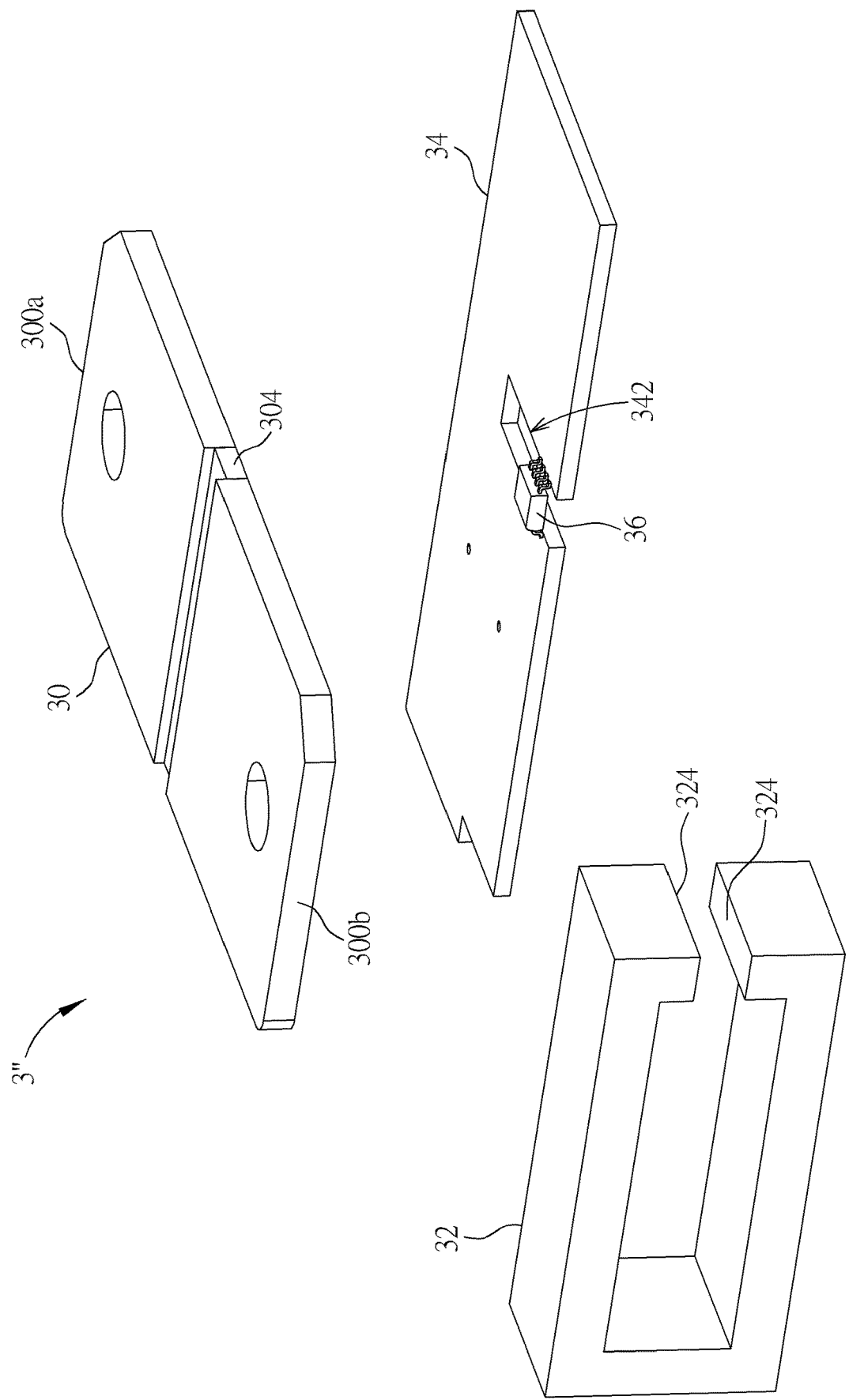
FIG. 13 is an exploded view illustrating the current sensing module shown in FIG. 12.
Figure 14:
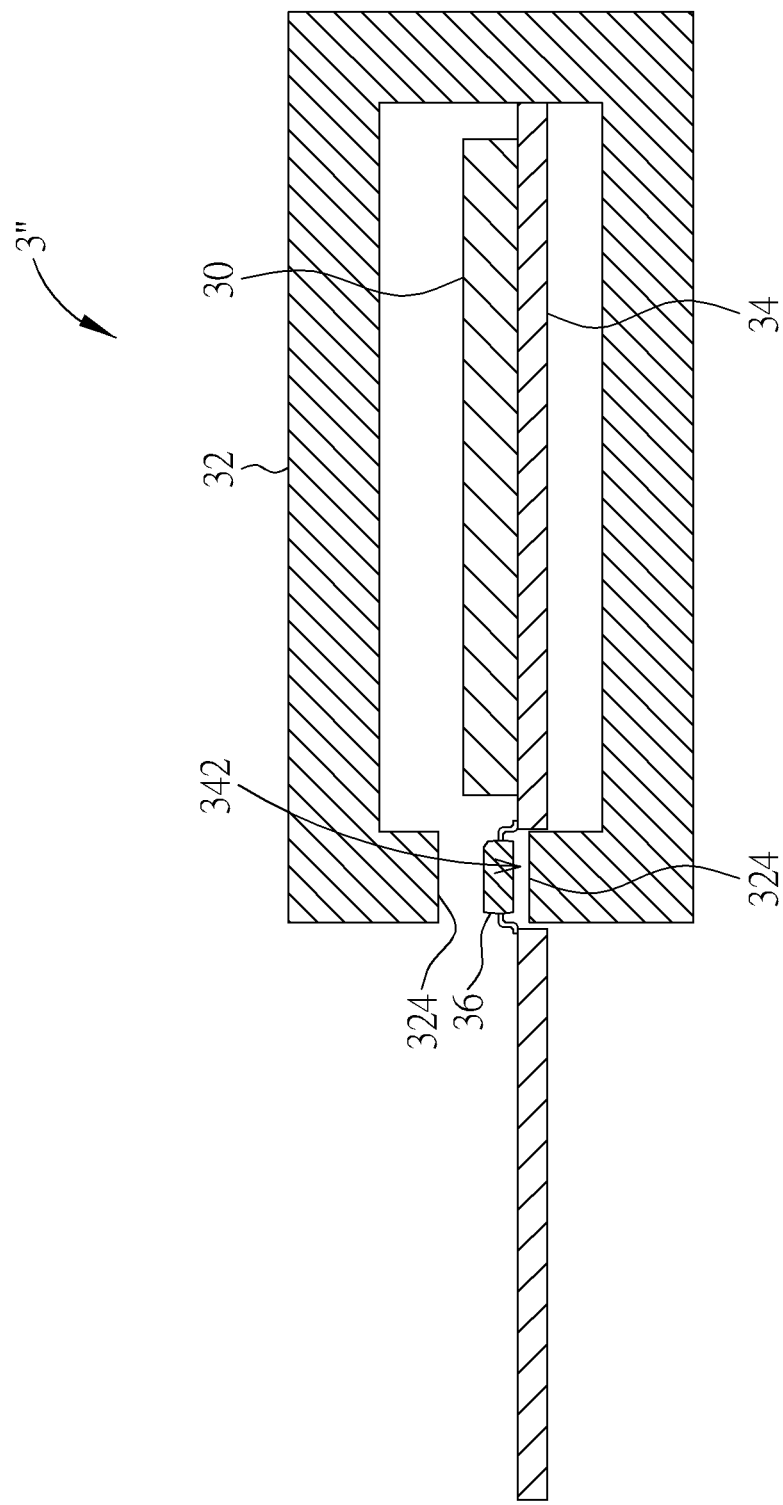
FIG. 14 is a sectional view illustrating the current sensing module shown in FIG. 12 along line Z-Z.

Referring to FIGS. 12 to 14, FIG. 12 is a perspective view illustrating a current sensing module 3" according to another embodiment of the invention, FIG. 13 is an exploded view illustrating the current sensing module 3" shown in FIG. 12, FIG. 14 is a sectional view illustrating the current sensing module 3" shown in FIG. 12 along line Z-Z. The main difference between the current sensing module 3" and the aforesaid current sensing module 3 is that the frame 32 of the current sensing module 3" is C-shaped, as shown in FIGS. 12 to 14. Furthermore, the circuit board 34 of the current sensing module 3" has an opening 342 and the magnetic sensor 36 crosses the opening 342. The opening 342 corresponds to a gap between two opposite surfaces 324 of the frame 32, such that the magnetic flux of the gap passes through the opening 342 of the circuit board 34. By means of the C-shaped frame 32, the invention may simplify the process of assembly and shorten the gap, so as to reduce the size of the current sensing module 3".

As mentioned in the above, the magnetic sensor is located inside the frame. Since the frame can increase magnetic flux, stabilize magnetic field and reduce external interference for the magnetic sensor, the current sensed by the magnetic sensor will be more accurate. Accordingly, the reliability of the current sensing module is enhanced. Furthermore, the first measurement circuit may be connected to the magnetic sensor and the second measurement circuit may be connected to the current-sensing resistor of the conductive substrate, wherein the first measurement circuit and the second measurement circuit operate independently. Accordingly, if one of the first measurement circuit and the second measurement circuit fails, the other one can still operate normally. When the current sensing module of the invention is applied to a vehicle system, it may enhance the safety of the vehicle system greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current sensing module for measuring a current comprising:
   a conductive substrate having two terminals and at least one slot, the current flowing from one terminal to the other terminal, the at least one slot extending in a direction of the current;
   a frame having two side portions and a bottom portion, the bottom portion connecting the two side portions to form an opening ring-shape, the two side portions being parallel to each other, at least one of the two side portions being disposed in the at least one slot, such that the two side portions surround a partial path of the current, a first current path being located within the frame and partially encapsulated by the frame, a second current path being located at at least one outside of the frame without being encapsulated by any frame for sensing the current, a gap existing between two top ends of the two side portions;

a circuit board disposed with respect to the conductive substrate; and a magnetic sensor connected to the circuit board and located in a space between the two side portions rather than in the gap, the magnetic sensor sensing the current and generating a first current sensing signal correspondingly.

2. The current sensing module of claim 1, wherein the conductive substrate is a bus bar having a resistivity difference within a predetermined range from $1.59 \times 10^{-8}$ Ωm to $1.1 \times 10^{-7}$ Ωm.

3. The current sensing module of claim 1, wherein the conductive substrate further comprises a current-sensing resistor and two sensing portions, a resistivity of the current-sensing resistor is 10 to 100 times a resistivity of each of the two terminals, the current-sensing resistor is connected in a current path between the two terminals to form a shunt, the two sensing portions are disposed at opposite sides of the current-sensing resistor, and a second current sensing signal corresponding to the current is generated between the two sensing portions.

4. The current sensing module of claim 3, further comprising:

a first measurement circuit connected to the magnetic sensor; and a second measurement circuit connected to the current-sensing resistor;

wherein the first measurement circuit and the second measurement circuit operate independently.

5. The current sensing module of claim 4, further comprising a temperature sensor connected to the circuit board and thermally coupled to the conductive substrate, the temperature sensor sensing a temperature of the conductive substrate and generating a temperature sensing signal correspondingly.

6. The current sensing module of claim 5, wherein the second measurement circuit calibrates the second current sensing signal according to the temperature sensing signal.

7. The current sensing module of claim 5, further comprising a thermal conductive material covering the temperature sensor and the conductive substrate.

8. The current sensing module of claim 1, further comprising two magnetic structures disposed between the two side portions, heights of the two magnetic structures being smaller than heights of the two side portions, the magnetic sensor being located between the two magnetic structures.

9. The current sensing module of claim 1, wherein a width W between the two side portions and a height H between the magnetic sensor and the top end of the side portion satisfy an inequality as follows:

$$\frac{W}{4} \leq H \leq \frac{W}{2}.$$

10. The current sensing module of claim 1, wherein a percentage of the conductive substrate surrounded by the two side portions is between 50% and 90%.

11. The current sensing module of claim 1, wherein the frame is grounded to the circuit board by a wire or solder.

12. The current sensing module of claim 1, wherein the frame is made of Permalloy with grain size between 350 μm and 600 μm.

13. The current sensing module of claim 1, wherein an electrical insulating material with low thermal conductivity is filled between the conductive substrate and the frame.

14. A current sensing module for measuring a current comprising:

a conductive substrate having two terminals, the current flowing from one terminal to the other terminal;

a frame surrounding the conductive substrate, the frame having two opposite surfaces, the current passing through a space between the two opposite surfaces to generate a magnetic flux, the frame being made of Permalloy with grain size between 350 μm and 600 μm;

a circuit board disposed with respect to the conductive substrate; and a magnetic sensor connected to the circuit board and located between the two opposite surfaces.

15. The current sensing module of claim 14, wherein the conductive substrate is a bus bar having a resistivity difference within a predetermined range from $1.59 \times 10^{-8}$ Ωm to $1.1 \times 10^{-7}$ Ωm.

16. The current sensing module of claim 14, wherein the conductive substrate further comprises a current-sensing resistor and two sensing portions, a resistivity of the current-sensing resistor is 10 to 100 times a resistivity of each of the two terminals, the current-sensing resistor is connected in a current path between the two terminals to form a shunt, the two sensing portions are disposed at opposite sides of the current-sensing resistor, and a second current sensing signal corresponding to the current is generated between the two sensing portions.

17. The current sensing module of claim 16, further comprising:

a first measurement circuit connected to the magnetic sensor; and a second measurement circuit connected to the current-sensing resistor;

wherein the first measurement circuit and the second measurement circuit operate independently.

18. The current sensing module of claim 17, further comprising a temperature sensor connected to the circuit board and thermally coupled to the conductive substrate, the temperature sensor sensing a temperature of the conductive substrate and generating a temperature sensing signal correspondingly.

19. The current sensing module of claim 18, wherein the second measurement circuit calibrates the second current sensing signal according to the temperature sensing signal.

20. The current sensing module of claim 18, further comprising a thermal conductive material covering the temperature sensor and the conductive substrate.

21. The current sensing module of claim 14, further comprising two magnetic structures disposed between the two side portions, heights of the two magnetic structures being smaller than heights of the two side portions, the magnetic sensor being located between the two magnetic structures.

22. The current sensing module of claim 14, wherein the frame has two side portions and a bottom portion, the bottom portion connects the two side portions to form an opening ring-shape, the two side portions are parallel to each other, the conductive substrate is located between the circuit board and the bottom portion.

23. The current sensing module of claim 14, wherein the frame is C-shaped, the circuit board has an opening, and the magnetic sensor crosses the opening.

24. The current sensing module of claim 14, wherein the frame is grounded to the circuit board by a wire or solder.

25. The current sensing module of claim 14, wherein an electrical insulating material with low thermal conductivity is filled between the conductive substrate and the frame.

\* \* \* \* \*